United States Patent [19]

Subramaniam

[11] Patent Number: 5,094,915
[45] Date of Patent: Mar. 10, 1992

[54] LASER-EXCITED SYNTHESIS OF CARBON FILMS FROM CARBON MONOXIDE-CONTAINING GAS MIXTURES

[75] Inventor: Vishwanath V. Subramaniam, Powell, Ohio

[73] Assignee: The Ohio State University, Columbus, Ohio

[21] Appl. No.: 525,235

[22] Filed: May 16, 1990

[51] Int. Cl.$^5$ .................... C23C 16/26; C23C 16/48; B32B 9/00
[52] U.S. Cl. .................. 428/408; 427/53.1; 427/249; 423/446
[58] Field of Search ............ 427/53.1, 249; 428/408; 423/446

[56] References Cited

U.S. PATENT DOCUMENTS 4,472,456 9/1984 Shah .................... 427/53.1

FOREIGN PATENT DOCUMENTS 61-151097 7/1986 Japan .

OTHER PUBLICATIONS

Hanssen et al., "Diamond Synthesis Using an Oxygen-Acetylene Torch" *Materials Letters*, vol. 7, No. 7, 8, Dec. 1988, pp. 289-292.
Meyer et al., "Radio-Frequency Plasma Chemical Vapor Deposition Growth of Diamond", *J. Vac. Sci. Technol. A*, vol. 7, No. 3, May/Jun. 1989, pp. 2325-2327.
Deshpandey et al., "Diamond and Diamondlike Films: Deposition Processes and Properties" *J. Vac. Sci. Technol. A*, vol. 7, No. 3, May/Jun. 1989, pp. 2294-2302.
Urban et al., "Treanor Pumping of CO Initiated by CO Laser Excitation", *Chem. Phys.*, vol. 130, 1989, pp. 389-399.
Rich et al., "$C_2$ and CN Formation by Optical Pumping of CO/Ar and $CO/N_2$/Ar Mixtures at Room Temperature", *Chem. Phys.*, vol. 44, 1979, pp. 53-64.
Bergman et al., "$^{13}C$ Isotope Separation by Laser Excitation of CO", *Proc. Intl. Conf. Lasers*, 1980, pp. 265-269.
Anex et al., "Transfer and Storage of Vibrational Energy in Liquids: Collisional Up-Pumping of Carbon Monoxide in Liquid Argon", *J. Phys. Chem.*, vol. 90, 1986, pp. 1604-1610.
Treanor et al., "Vibrational Relaxation of Anharmonic Oscillators with Exchange-Dominated Collisions", *J. Chem. Phys.*, vol. 48, No. 4, 1968, p. 1798.

*Primary Examiner*—Michael Lusignan
*Assistant Examiner*—Margaret Burke
*Attorney, Agent, or Firm*—Frank H. Foster

[57] ABSTRACT

The invention relates to a method for forming a carbon film on a substrate by irradiating a carbon monoxide-containing gas with an emission from a carbon monoxide laser without irradiating the substrate with the laser emission. The carbon film can be diamond, amorphous carbon, or graphite and the carbon film can be $C^{13}$-enriched or pure $C^{13}$ by varying the isotope content of the CO gas in the chamber and/or in the laser.

43 Claims, 1 Drawing Sheet

LASER-EXCITED SYNTHESIS OF CARBON FILMS FROM CARBON MONOXIDE-CONTAINING GAS MIXTURES

TECHNICAL FIELD

The invention relates to a method for the deposition of thin carbon films, including graphite and diamond, by the carbon monoxide laser-excitation of a gas mixture comprising carbon monoxide. The gas mixture being excited can also be varied to include carbon monoxide/hydrogen/argon, or other mixtures such as ammonia, nitrous oxide, nitric oxide and nitrogen. The invention also relates to a method to deposit $C^{13}$ enriched films and to devices containing such films. Semiconducting films, both n-type and p-type, are provided by using the appropriate dopant in the gas mixture.

BACKGROUND ART

Diamond is an extremely hard, electrically insulating allotrope of carbon which has a very high thermal conductivity, nearly five times the thermal conductivity of copper at room temperature. Diamond is also transparent over a wide range of the electromagnetic spectrum. These properties make diamond an ideal material for wear-protective coatings, optical windows, and efficient heat sinks in large-scale integrated circuits.

Diamond films can be grown by various chemical vapor deposition (CVD) techniques, including, among others, low pressure synthesis of polycrystalline and monocrystalline films. The two most widely used techniques are plasma-assisted chemical vapor deposition (PACVD) and the hot-filament process. In PACVD, a microwave or radio-frequency (of the order of MHz) generated discharge is struck in a gaseous mixture of a hydrocarbon (eg. methane, propane, or acetylene, etc.) and hydrogen. Usually, a substrate material, such as silicon, is placed directly interior to a flowing electrical discharge. The carbon-bearing gas mixture is highly dissociated by the action of the microwave discharge. In turn, various molecular and radical species, as well as ions and electrons are formed eventually leading to the observed diamond thin film production. For successful conventional diamond film synthesis, the gas mixture should contain less than about 5 volume % hydrocarbons. The films are typically grown at a rate of several microns per hour, on monocrystalline silicon substrates at temperatures on the order of 800 to 1000 degrees Centigrade. However, there are several complicating and detrimental effects present including poor control over grain sizes in the polycrystalline diamond films, and inability of other substrate materials to withstand such high temperatures, non-uniform heating, non-uniform gas flow patterns, and etching of the substrate or the developing diamond thin film.

The hot filament process uses a similar gas mixture and a tungsten or thoriated-tungsten filament suspended a few millimeters from the substrate surface. The filament is heated resistively and it serves to excite the gas mixture as well as to heat the substrate. Growth rates by this method are comparable to those by PACVD. Diamond films have also been synthesized by using an oxy-acetylene torch (Hanssen et al., Materials Letters, Vol. 7, Number 7,8, page 289–292, Dec. 1988).

Conventional CVD systems which have utilized carbon monoxide (CO) and hydrogen mixtures as the precursor materials for the deposition of thin carbon films have used electrical discharges, i.e., radio frequency (RF), or microwave. $CO-H_2$ mixtures cannot be used in the hot filament process because the dissociation energy of the CO molecule is large (about 10 eV). Nevertheless, $CO-H_2$ discharge systems are desirable because they are simpler and lend themselves to thorough theoretical and experimental study more readily than their hydrocarbon-hydrogen counterparts. Furthermore, it is known that the CO partial concentration can be varied over a wide range (eg. 5% to 80%) with little variation in the deposition rate. (See Ito, Idemitsu Petrochemical Corporation, presentation at the Gorham Advanced Materials Institute Conference on Investment, Licensing, and Strategic Partnering Opportunities, Emerging Technologies Applications and Markets for Diamond and DLC Coatings, Oct. 15–17, 1989, Marco Island, Fla.; and Meyer et al., J. Vac. Sci. Technol. A, Vol. 7, pp. 2325, 1989) This is in marked contrast to the hydrocarbon counterparts which cannot exceed 5 volume % partial concentration of hydrocarbon in the gas mixture. (See Deshpandey and Bunshah, J. Vac. Sci. Technol. A 7 (3), May/June 1989)

Mixtures of CO-Ar and CO-He at pressures ranging from 10 to 100 torr have been optically pumped by lasers at room temperature (Urban et al., Chem. Phys., 130, 389 (1989))

It is known to use a CO laser to optically pump very highly pressurized liquid CO. Such a system, however, is too dense to form a film and cannot deposit diamond.

Prior methods of using lasers to assist in CVD of thin diamond-like films have used the laser to heat the substrate or to photo dissociate the carbon-bearing gas. The optical pumping of CO with a CO laser is also known but not for producing diamond films.

Gaseous mixtures of $CO/Ar$ and $CO/N_2/Ar$ have been optically pumped at room temperature with a CO laser (J. W. Rich et al. "$C_2$ and CN Formation by Optical Pumping of $CO/Ar$ and $CO/N_2/Ar$ Mixtures at Room Temperature", Chem. Phys., Vol. 44, No. 1, Nov. 15, 1979). In this same work, it is also shown that the $C_2$ product formed in the gas phase is enriched in the $C^{13}$ isotope by as much as 20%. Similar enrichments (~15%) were also reported by the same authors in another experiment in which the isotope containing products were $C_2$, $CO_2$, and $C_3O_2$. (Bergman and Rich, Proc. Intl. Conf. Lasers, pp. 265–269, 1980) That the isotope species can receive energy either directly from the beam or by collisions with vibrationally excited $C^{12}O^{16}$ is demonstrated by the experiment of Anex and Ewing (J. Phys Chem., Vol. 90, pp. 1604–1610, 1986). In their experiment, isotopically pure CO (88% $C^{13}O^{16}$ and 12% $C^{13}O^{18}$) in liquid argon was successfully vibrationally excited up to about level $v=20$ by irradiating the liquid mixture with beam energy from a CO laser operating on its lowest vibrational transitions (i.e., $v=1 \to v=0$, $v=2 \to v=1$, and higher).

BRIEF DISCLOSURE OF INVENTION

The present invention is directed to a process for the deposition on a substrate of carbon films from a gaseous mixture comprising carbon monoxide by irradiating the gaseous mixture with a carbon monoxide laser in the presence of a substrate. The carbon film deposited can be amorphous carbon, graphite, or diamond, and, if desired, can contain other materials such as dopants, by the introduction of the appropriate precursor materials into the gaseous mixture. The type and thickness of the film deposited can be varied by, among other methods, varying the temperature of the substrate.

The invention does not necessarily involve the laser-induced heating of the substrate (although it need not be precluded) nor does the invention involve the photo-dissociation of the CO molecule in the gas mixture by the CO laser light source. Rather, the invention involves the vibrational excitation of the CO molecules by optically pumping the CO molecules in the CO-containing gas mixture with the emission from the CO laser so that the carbon in the CO molecules or radical species in the gas mixture will react preferentially with, and/or adhere to, the surface of the substrate. The vibrational excitation by optical pumping is achieved virtually instantaneously, i.e., on the order of milliseconds. The vibrational excitation is readily achieved in the present invention because the same type of material (CO) is being used to both receive and generate the laser energy. This provides an excellent match between the energy levels of the lasing material and the vibrational energy levels of the absorbing material. This is to be distinguished from photodissociation in which the CO molecule would actually dissociate because of direct multiphoton absorption. (Treanor et al., J. Chem. Phys., Vol. 48, pp. 1798, 1968) By contrast, in the present invention, the emission from the CO laser is absorbed by the CO molecule and then redistributed via vibration-to-vibration energy transfer collisions.

The optional presence of hydrogen in the CO-containing gaseous mixture, it is believed, serves to scavenge up any non $sp^3$ bonded carbon such as graphite or amorphous carbon. By the present invention, little hydrogen need be present in the gas mixture if films of amorphous carbon are desired. Thus by the present invention, the concentration of CO in the gas mixture can range from about 1 to 100 volume percent. This high level of CO in the gas mixture differs significantly from the limitations of the prior art wherein the concentration of carbon-bearing gas used in PACVD is limited to less than about 5 volume percent of the gas mixture.

The present invention also relates to a method to deposit on a substrate a carbon film enriched in $C^{13}$.

Figure 1:
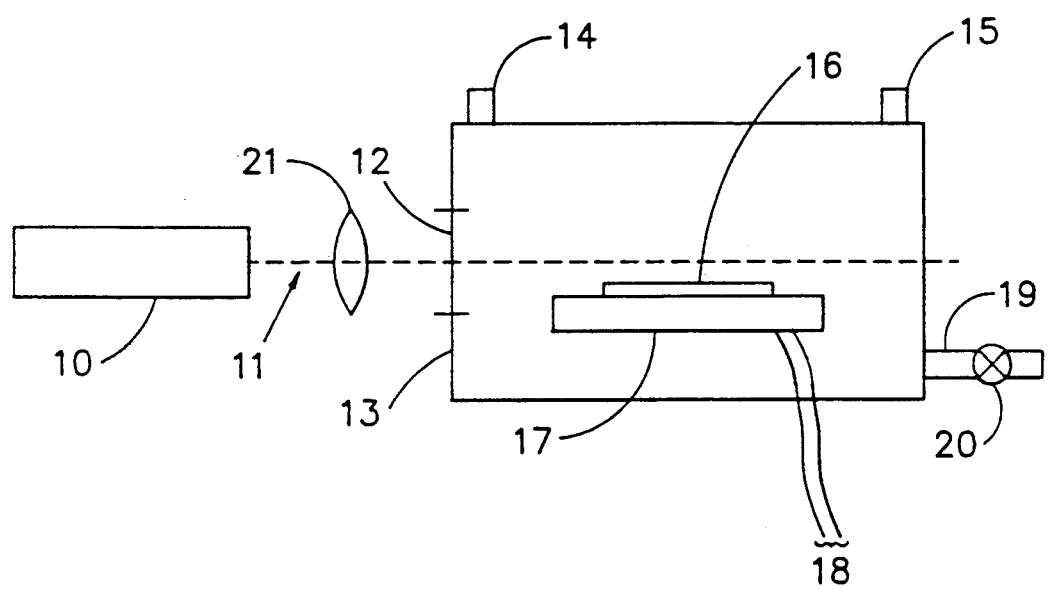
FIG. 1 shows a schematic drawing of the simplest form of the apparatus for the present invention.

The embodiment of the invention shown in FIG. 1, shown without spectroscopic or analytical instrumentation, depicts a CO laser 10 which emits a laser beam or emission 11 which is directed into a chamber 13 through a laser transparent window 12. The emission 11 can be focused or directed, by an optional focusing lens 21, to an area immediately above the target substrate 16 which is held in place by the substrate support 17. The substrate support 17 can be any material able to withstand the deposition conditions in the chamber 13 and is connected to electrical filaments or leads 18 used to carry electrical current to the substrate support 17 which in turn will heat up due to the electrical resistance and thereby raise the temperature of the substrate 16. The CO gas is introduced into the chamber 13 through the CO inlet 14 and any desired scavenger gas, such as hydrogen, or a diluent gas, such as argon or helium, or a dopant gas such as disilane or diborane or $C^{13}O$, is introduced through the secondary gas inlet 15. Alternatively, the CO can be premixed with a diluent gas and admitted into the chamber 13 by way of inlet 14 or 15. An outlet 19 is connected to a vacuum pump via a control valve 20 for reducing and increasing the pressure within the chamber 13 when desired.

In describing the preferred embodiment of the invention which is illustrated in the figure, specific terminology will be resorted to for the sake of clarity. However, it is not intended that the invention be limited to the terms so selected and it is to be understood that each specific term includes all technical equivalents which operate in a similar manner to accomplish a similar purpose.

DETAILED DESCRIPTION

The present invention is directed to a method for the laser-excited chemical vapor deposition (LECVD) of carbon, a method which is inherently different from laser assisted chemical vapor deposition (LACVD) and plasma assisted chemical vapor deposition (PACVD). Unlike prior art related to the formation of carbon films, such as graphite or diamond and diamond-like films from a carbon-bearing gaseous precursor, the present invention does not require a hydrocarbon-hydrogen mixture. The carbon source in the present invention is carbon monoxide (CO).

Furthermore, the energy source for the vibrational excitation of the CO is not RF, microwave, electron beam, or electric arc, but is a CO laser 10 preferably operating on the lowest CO vibrational transition (shortest wavelength) to optically pump the CO-containing gas mixture.

The present invention also differs from the prior art in that the substrate 16 onto which the carbon film is to be deposited is heated independently from the gasphase excitation of the CO. This makes it possible to obtain thin graphite, diamond, or diamond-like films at temperatures lower than those previously reported, which are often over 800 degrees Centigrade.

In the present invention, excitation of the CO in the gas mixture by irradiation from a CO laser operating on a number of different transitions including the two lowest vibrational transitions (vibrational quantum number $v=1 \rightarrow v=0$ and $v=2 \rightarrow v=1$) provides a cleaner environment compared to that of a discharge, flame, or hot filament technique of excitation. Furthermore, the use of the lower vibrational transitions allows pumping up to high energy levels of several eV without elevation of the temperature. Because this invention uses direct vibrational excitation of the carbonaceous source instead of indirect excitation (such as by first heating the substrate or excitation by electron impact) or photodissociation, the invention is inherently different from existing CVD processes that employ lasers.

At room temperature, most of the CO molecules in the gas mixture are in the lowest vibrational states ($v=0$ or $v=1$) of the ground electronic state. Therefore, in order to vibrationally excite the CO in the gas mixture using a CO laser, it is necessary that some of the energy from the laser 10 be distributed on the $v=1 \rightarrow v=0$ or on the $v=2 \rightarrow v=1$ transition. Typically, CO lasers operate on vibrational transitions $v=5 \rightarrow v=4$ and above. Lasing on shorter wavelength transitions, such as the $v=1 \rightarrow v=0$ and $v=2 \rightarrow v=1$ transitions, can generally be achieved by careful thermal design or by Q-switching. In the present invention, the shift in distribution of energy in the CO laser emission 11 to these preferred shorter wavelength transitions is achieved by careful thermal design. Q-switching is utilized only if the $v=1 \rightarrow v=0$ operation is desired.

In a preferred embodiment of the present invention, the CO laser emission 11 is focused into the center of a cavity or chamber 13 immediately above the surface of the substrate 16 onto which will be deposited the carbon film. The substrate 16 is independently heated by, for example, being in contact with heating filaments 18 which can heat via electrical resistance a substrate support 17. However, conventional methods for heating the substrate 16 are also operative herein. In a preferred embodiment, the substrate 16 is heated by resistance heating to a temperature in the range of from about 25 degrees Centigrade to below the softening point of the substrate 16.

The gases are introduced at a desired pressure into the cavity or chamber 13 in which the substrate 16 is located and the gas mixture is then subjected to the energy beam 11 emitted from the CO laser 10. In this manner, the carbon-containing molecules absorb energy from the laser emission 11, and after successive collisions, become vibrationally excited. Then, upon contact with the substrate 16, the vibrationally excited carbon-containing molecules form or deposit a carbon film thereupon.

A significant and unique feature of the present invention is that the deposition of the thin carbon films is not limited to conditions of reduced pressures in the chamber 13. In fact, by the present invention, the yield of deposited carbon increases with increased gas pressure within the chamber 13. The increased gas pressure within the chamber 13 allows greatly increased yield of deposited film relative to prior art low pressure CVD techniques. Thus the total gas pressure can range from about 5 torr to above one atmosphere. The upper limit of the total gas pressure according to the present invention is limited only by the design of the apparatus and its ability to withstand the pressures.

Furthermore, laser pumping of a $CO/H_2$ gas mixture can continue with increased pressure in the chamber although the gases may desirably be diluted with, for example, argon, hydrogen, krypton, xenon, or helium. In addition, nitrogen, nitric oxide, or nitrous oxide can be used in the gas mixture as diluents or to introduce nitrogen into the deposited films.

Thus by the present invention a CO laser 10 was used to vibrationally excite a mixture of CO and $H_2$ in a six-arm Varian cross apparatus. The approximate partial pressures of the CO and $H_2$ are, for example, 10 to 100 and 5 to 50 torr, respectively. In a preferred embodiment, the partial pressures are CO=20 torr, $H_2$=40 torr, and Ar 80 torr, however, these are not limitations herein.

For certain applications and uses of diamond coated substrates, or amorphous carbon coated substrates, or graphite coated substrates, it is desirable to have enhanced $C^{12}$ or $C^{13}$ content. This could have utility in, for example, semiconductor devices due to the minute differences in mass of the $C^{13}$ vs. the $C^{12}$ and could provide films of higher resistance/conductance.

Therefore, a particular advantage of the use of the CO laser emission 11 to irradiate CO by the present invention is the ability to deposit preferentially the $C^{13}$ isotope in the carbon films. This is achieved according to the present invention because of the slightly higher mass of the $C^{13}$ isotope relative to that of the $C^{12}$ which will cause the $C^{13}$ isotope atoms to become vibrationally excited preferentially. Alternatively, the excitation source CO laser 10 could be made to operate using isotopically pure CO. Thus the film deposited by the present invention will be enriched in $C^{13}$ compared to the distribution of $C^{13}$ in the CO gas mixture. This use of a CO laser 10 to deposit a carbon film enriched in $C^{13}$ on a substrate is not previously known and the $C^{13}$ carbon films thus deposited will differ in $C^{13}$ content from conventional CVD carbon films.

Also by the present invention, a carbon film containing only the $C^{13}$ isotope can be deposited if the carbon monoxide in the gas mixture is $C^{13}O$. Thus a $C^{13}$ diamond film, or a $C^{13}$ amorphous carbon film, or a $C^{13}$ graphite film can be deposited on the substrate by using pure $C^{13}O$ as the carbon source and using the deposition procedures described above.

By the present invention, one can also use $C^{13}O$ in the CO laser 10 and $C^{13}O$ in the gas mixture to enhance the deposition of $C^{13}$ as a diamond, amorphous carbon, or graphite film.

Similarly, a carbon film free of the $C^{13}$ isotope can be deposited according to the present invention by using as the carbon source in the gas mixture $C^{13}$ isotope-free CO. Thus a $C^{13}$-free diamond film, or a $C^{13}$-free amorphous carbon film, or a $C^{13}$-free graphite film can be deposited on the substrate 16 by using $C^{13}$-free CO as the carbon source in the gas mixture and using the deposition procedures described above.

Thus by the present invention one could selectively deposit on a substrate 16 a carbon film of $C^{13}$ as, for example, diamond, or amorphous carbon, or graphite followed by, or preceded by, the deposition of a different film selected from this same group. Thus a composite or multilayer film structure could be prepared according to the present invention by sequentially changing the carbon-containing gas mixture from CO to $C^{13}O$ to $C^{13}$-free CO. In this manner, multilayer composites of different carbon films and different isotopes or different isotope concentrations can be prepared.

In another embodiment of the present invention various mask works such as positive and/or negative photoresists are provided in which a desired pattern or circuit deposited on the substrate 16 comprises, for example and not limited to, a $C^{13}$ film while other areas on the substrate have, for example, a $C^{12}$ film or a $C^{13}$-free film deposited according to the procedures described above.

In yet another embodiment of the present invention, it is possible to introduce a dopant in the gas phase into the gas mixture which is irradiated by the CO laser emission 11. For certain applications, such as the manufacture of semiconductors, various dopants are desired in the films. Thus, boron is often introduced in the form of diborane ($B_2H_6$) as a dopant to make p-type semiconducting materials. In the present invention, diborane, for example, can be added to the gas mixture which will introduce boron into the carbon film deposited on the substrate. In this manner, a p-type semiconducting film is prepared by irradiating the dopant/gas mixture with the CO laser emission 11. The boron dopant is not limited to diborane and other boron-containing dopant precursors are known to those skilled in the art.

The dopant used herein in the manufacture of semiconductor films or devices is not limited to boron, but can include all Group IIIA and Group VA elements, or mixtures thereof. If the dopant is nitrogen, one can produce by this invention n-type semiconductors, which are not previously known. The semiconducting films thus produced can be with or without the $C^{13}$ enrichment described herein. Since it is generally desirable to have the dopant be close in atomic mass to the atomic mass of the bulk material in the semiconductor the present invention provides the advantage of producing a bulk film of $C^{13}$ with a dopant of $N^{14}$, or a bulk film of $C^{12}$ with a dopant of $B^{12}$.

A cleaned silicon substrate previously placed into this environment was heated by electrical resistance using a tungsten filament to a temperature in the range of from ambient to 400 degrees Centigrade for up to four hours. Longer or shorter heating periods are also operative herein. During this time, the $CO/H_2$ gas mixture was subjected to the CO laser beam about 1 centimeter above the surface of the silicon substrate resulting in the deposition of a carbon film several microns thick on the surface of the silicon substrate.

In this manner the carbonaceous source itself, i.e., the carbon in the CO, was directly excited by the laser 10 while the substrate 16 was not excited by the laser 10.

In a preferred embodiment of the present invention, the gas mixture is at a translational temperature in the range of from about 90 to 300 degrees Kelvin and at a pressure of at least 10 torr. Thus the CO or CO and diluent are preferably cooled before being introduced into the chamber 13.

The shortest wavelength of the CO laser emission can be from about 4.7 to about 6.0 microns and is more preferably from about 4.7 to 5.5 microns.

The average power of the laser emission 11 can be from about 200 milliwatts to about 25 watts and is preferably about 1 to 10 watts. Lower energy input is operative herein but may reduce deposition rates. However, excessively high power input may result in heating of the gas molecules thereby reducing the vibrational excitation.

It is also preferred herein for the production of films containing crystalline carbon that the gas mixture contain from 5 to 95 volume percent carbon monoxide and that the rest of the gas mixture comprise predominantly hydrogen gas or hydrogen in an inert diluent. The gas mixture can also, however, contain other sources for the in situ generation of hydrogen useful for scavenging non-$sp^3$ bonded carbon atoms. Such additional hydrogen sources can include, for example, but are not limited to, ammonia, which can also serve to introduce nitrogen into the deposited film in the form of nitrides, and silanes, which can serve to introduce silicon. In addition, crystallinity of the deposited film is enhanced by elevated substrate 16 temperatures.

For depositing amorphous carbon films by the present invention, it is preferred herein to utilize pure CO as the carbon source. Deposition of amorphous carbon films is further enhanced by not heating the substrate 16.

The amorphous carbon, diamond, or diamond-like films produced by the present invention will vary in thickness from monoatomic dimensions to any desired thickness. Thus a preferred carbon film thickness is from several Angstroms up to several millimeters. The thickness can be increased by increasing the partial pressure of CO in the gas mixture, or increasing the laser emission power, or varying the substrate 16 temperature, or increasing the residence time of the substrate 16 in the deposition chamber 13, or any combination thereof.

The film deposited can comprise a mixture of amorphous carbon, graphite, diamond, and/or diamond-like material. The proportion of amorphous carbon deposited relative to the diamond deposited can be increased by eliminating the hydrogen and diluent in the gas mixture, or optically pumping pure CO at room temperature, or both. The proportion of diamond or diamond-like material of the deposited film can be increased by operating at a higher temperature (eg. >800 degrees Centigrade) for prolonged periods (eg. >8 hours) with essentially equal amounts of CO and $H_2$. Also by post annealing at high temperatures the deposited film in a scavenging gas selected from the group consisting of hydrogen, chlorine, fluorine, oxygen, and mixtures thereof, the diamond content of the film can be increased and the amorphous carbon or graphite content of the film can be decreased. In a similar manner, one can by the present invention increase the degree of crystallinity (diamond or graphite content) of the deposited film by alternating periods of LECVD followed by periods of annealing at elevated temperatures (eg. 900 degrees Centigrade) in pure hydrogen without the laser emission 11. Repeated cycles of such alternating periods will serve to further purge or scavenge the film of non-$sp^3$ bonded carbon.

In a preferred embodiment of the present invention, the substrate 16 is selected from the group consisting of diamond, graphite, amorphous carbon, monocrystalline silicon, polycrystalline silicon, monocrystalline sodium chloride, silicate glass, silicon carbide, silicon nitride, boron nitride, fluorosilicate glass, fluoroborosilicate glass, sapphire ($Al_2O_3$), titanium, tungsten, thoriated tungsten, molybdenum, platinum, copper, nickel, iron, iron oxide, germanium, steel, and oxides thereof and mixtures thereof. However, the operative substrates are not limited to these preferred substrates and other materials or oxides able to withstand the deposition conditions and known to those skilled in the art are also useful herein.

In yet another embodiment of the present invention, the substrate can be dissolved away or etched away after the carbon film has been deposited or formed thereon by the methods described above. A free-standing carbon film is thereby produced, which can by the present invention be a diamond film, an amorphous carbon film, a graphite film, any of which could be of the $C^{13}$-enriched type, and/or the boron-doped or nitrogen-doped (or other dopants) types. This is most easily achieved by selecting as the substrate 16 a water soluble material, such as sodium chloride, or an acid etchable material, such as nickel.

EXAMPLE 1

A silicon (001-oriented) substrate was soaked in acetone for 10 minutes, soaked in 50% diluted HF acid for 10 minutes, and thoroughly rinsed in deionized water. Following this standard cleaning procedure, the substrate was placed on top of the 2% thoriated tungsten filament heating elements on the substrate support inside the Varian six-arm cross apparatus chamber. A volume flow of 90.1 sccm of CO was then introduced followed by 5.1 sccm of hydrogen with the exit valve fully open. The exit valve was then closed partially until the desired pressure of 15 torr was reached. The CO laser beam was then focused into the chamber approximately 1 centimeter above the substrate surface in order to verify that the gas was vibrationally excited at least up to level $v=27$. A visible sign of this excitation is the characteristic blue glow of the $C_2$ Swan bands produced by the reacting vibrationally excited CO. The beam or emission was then blocked off. The power supply to the heater was then turned on and the filament was heated slowly until the desired temperature of about 354 degrees Centigrade was reached. The temperature was recorded by a thermocouple suspended about a millimeter above the substrate surface. At this point, the flow and heating conditions were set and the CO laser beam was focused into the gas about 1 centimeter above the substrate surface. After maintaining these conditions for about 4 hours, the laser beam was blocked off, the substrate heating shut off, and the gas flows shut off. The chamber and piping were purged with nitrogen and the chamber was then pressurized to atmospheric conditions. The substrate was removed and placed into a vial.

The single best diagnostic test for detecting carbon films on crystalline substrates are Raman spectroscopy and Surface Enhanced Raman Spectroscopy (SERS). In the former, the green line (514.5 nm) from a tunable Argon ion laser is focused onto a region of the substrate and a spectrum of the radiation scattered by the substrate and film is detected by a scanning monochronometer. The silicon zeroth order and first order lines occur at 524 $cm^{-1}$ and 974 $cm^{-1}$. Crystalline graphite is observed to occur at 1560 $cm^{-1}$. A broad peak with a full width at half maximum of 100 $cm^{-1}$ centered at 1356 $cm^{-1}$ was observed and is indicative of disordered graphite, disordered diamond, and amorphous carbon. The structures of the materials represented by these peaks was further verified by SERS by first depositing a 3 nanometer thin film of silicon on top of the substrate and film.

EXAMPLE 2

A beta-SiC pellet sample consisting of a sintered powder was cleaned as per Example 1 and placed into the six-arm Varian cross apparatus chamber. A pressurized mixture consisting of 420 sccm of CO and 1815 sccm of Ar was then introduced into the chamber with the exit valve fully open. The exit valve was then partially closed until the desired pressure of 260 torr was attained in the chamber. The CO laser beam operating at 4.9 watts continuous wave (i.e., not Q-switched) was focused approximately 1 centimeter from the surface of the substrate for a few seconds to verify that the blue glow from the $C_2$ Swan bands was visible. The beam was then blocked. The substrate heater was turned on gradually until the desired temperature of 900 degrees F. or 480 degrees C., as indicated by the thermocouple 1 milliliter above the substrate surface, was reached. The CO laser beam was then focused into the region 1 centimeter above the substrate. The deposition conditions were then maintained for 2 hours. Following this period of time, the system was shut down and the substrate removed. Raman and SERS revealed the presence of graphite, disordered graphite and diamond-like carbon in the film.

EXAMPLE 3

A single crystal salt (NaCl 001) substrate was cleaved and placed directly into the Varian six-arm cross apparatus chamber. A premixed mixture consisting of a volume flow of 420 sccm of CO and 1815 sccm of Ar was introduced into the chamber with the exit valve fully open. Then a volume flow of 5.4 sccm of hydrogen was added into the chamber. The exit valve was closed partially until the desired pressure of 270 torr was attained within the chamber. The CO laser beam operating in a continuous wave at an average power of 3.9 watts was focused approximately 1 centimeter from the substrate surface for a few seconds to verify that the blue glow from the $C_2$ Swan bands was visible. The beam was then blocked, and the substrate heater turned on gradually until the desired temperature of 360 degrees F. as indicated by the thermocouple 1 millimeter above the substrate was reached. The CO laser beam was then focused into the region 1 centimeter above the substrate. The deposition conditions were then maintained for 2 hours. Following this period of time, the system was shut down, and the substrate was removed. The presence of graphite, amorphous carbon, and diamond in the film were verified by Raman and SERS spectroscopy.

While certain preferred embodiments of the present invention have been disclosed in detail, it is to be understood that various modifications may be adopted without departing from the spirit of the invention or scope of the following claims.

I claim:

1. A method of forming a carbon film on a substrate which method comprises subjecting a gas mixture comprising carbon monoxide, in the presence of a substrate, to vibrational excitation induced by an emission from a carbon monoxide laser, wherein the wavelength of the laser emission is from about 4.7 microns to about 6.0 microns, whereby a carbon film is formed on the substrate.

2. The method as claimed in claim 1 wherein the gas mixture contains from 1 to 100 volume percent carbon monoxide.

3. The method of claim 2 further comprising from 95 to 5 volume percent of one or more diluent, dopant, or scavenger gases selected from the group consisting of hydrogen, diborane, disilane, chlorine, fluorine, oxygen, ammonia, silane, argon, helium, nitric oxide, nitrous oxide, nitrogen, neon, krypton, and xenon.

4. The method of claim 1 wherein the substrate is selected from the group consisting of diamond, graphite, amorphous carbon, monocrystalline silicon, polycrystalline silicon, monocrystalline sodium chloride, silicate glass, silicon carbide, silicon nitride, boron nitride, fluorosilicate glass, fluoroborosilicate glass, sapphire ($Al_2O_3$), titanium, tungsten, thoriated tungsten, molybdenum, platinum, copper, nickel, iron, iron oxide, germanium, steel, and oxides thereof and mixtures thereof.

5. The method of claim 1 wherein the temperature of the gas mixture is from about 90 degrees Kelvin to about 300 degrees Kelvin.

6. The method of claim 1 wherein the total pressure of the gas mixture exceeds one atmosphere.

7. The method of claim 1 wherein the total pressure of the gas mixture is from about 5 torr to about one atmosphere.

8. The method of claim 3 wherein the partial pressure of carbon monoxide is from 10 to 100 torr and the partial pressure of hydrogen is from 5 to 50 torr.

9. The method of claim 1 wherein the average power of the laser emission exceeds 200 milliwatts.

10. The method of claim 1 wherein the average power of the laser emission is from about 1 to 10 watts.

11. The method of claim 1 wherein the carbon film formed comprises amorphous carbon.

12. The method of claim 1 wherein the carbon film formed comprises diamond.

13. The method of claim 1 wherein the carbon film formed comprises graphite.

14. The method of claim 11 wherein the amorphous carbon film formed is from several Angstroms to several millimeters in thickness.

15. The method of claim 12 wherein the film comprising diamond is from several Angstroms to several millimeters in thickness.

16. The method of claim 13 wherein the graphite film formed is from several Angstroms to several millimeters in thickness.

17. The method of claim 1 wherein the carbon monoxide in the gas mixture has an enriched $C^{13}$ content, whereby the carbon film formed has an enriched $C^{13}$ content.

18. The method of claim 1 wherein the carbon monoxide in the carbon monoxide laser comprises $C^{13}O$.

19. The method of claim 1 wherein the substrate is heated, but not by means of the laser, to a temperature in the range of from 25 degrees Centigrade to below the softening point of the substrate.

20. The method of claim 1 wherein the CO laser operates substantially on the $v=2 \rightarrow v=1$ and the $v=1 \rightarrow v=0$ short wavelength transitions.

21. The method of claim 17 wherein the carbon film formed is essentially $C^{13}$.

22. The method of claim 21 wherein the $C^{13}$-enriched film formed comprises diamond.

23. The method of claim 21 wherein the $C^{13}$ film formed is amorphous carbon.

24. The method of claim 21 wherein the $C^{13}$ film formed is graphite.

25. The method of claim 1 wherein a plurality of carbon films are deposited in successive layers onto the surface of the substrate.

26. The method of claim 25 wherein at least one of the carbon films deposited is $C^{13}$ enriched and at least one of the carbon films deposited is not $C^{13}$ enriched.

27. An amorphous $C^{13}$-enriched carbon carbon film deposited by the method of claim 1.

28. A $C^{13}$-enriched graphite film deposited by the method of claim 12.

29. A graphite-enriched carbon film deposited by the method of claim 13.

30. A $C^{13}$-enriched carbon film deposited by the method of claim 17.

31. The method of claim 1 wherein the gas mixture further comprises a dopant selected from the group consisting of Group IIIA elements, and mixtures thereof, whereby the carbon film formed is a p-type semiconducting film.

32. The method of claim 1 wherein the gas mixture further comprises a dopant selected from the group consisting of Group VA elements, and mixtures thereof, whereby the carbon film formed is a n-type semiconductor film.

33. The method of claim 1 further comprising the step of post annealing the carbon film n the presence of a gas selected from the group consisting of hydrogen, chlorine, fluorine, oxygen and mixtures thereof, and at a temperature sufficient to decrease the amorphous carbon content of the film and increase the diamond content of the film.

34. A free-standing $C^{13}$-enriched carbon film comprising diamond produced by dissolving or etching away the substrate from the carbon film deposited on said substrate by the method of claim 1.

35. The method of claim 31 wherein the dopant is selected from the group consisting of boron and boron$^{12}$-isotope.

36. The method of claim 32 wherein the dopant is selected from the group consisting of nitrogen and nitrogen$^{15}$-isotope.

37. The method of claim 21 wherein the gas mixture further comprises a dopant selected from the group consisting of a source of boron, a source of nitrogen, and a source of boron$^{12}$-isotope, whereby a semiconducting film is produced.

38. The method of claim 25 wherein the deposition of the plurality of carbon films is achieved by alternating periods of interrupting the carbon monoxide laser emission, wherein when the carbon monoxide laser emission is interrupted, the substrate is annealed at an elevated temperature in the presence of a scavenger gas, whereby the successive layers in the films deposited have enhanced crystallinity.

39. The method of claim 25 wherein, in the plurality of films, at least one of the carbon films is deposited in a desired pattern whereby a mask work is produced.

40. The method of claim 39 wherein each of the carbon films in the plurality of films is independently selected from the group consisting of amorphous carbon, diamond, and graphite.

41. The method of claim 26 wherein in the plurality of films at least one of the carbon films is deposited in a desired pattern whereby a mask work is produced.

42. A mask work produced by the method of claim 39, wherein the mask work comprises a $C^{13}$-enriched carbon film which is a photoresist device selected from the group consisting of positive and negative photoresists.

43. A mask work produced by the method of claim 41, wherein the mask work is a photoresist device selected from the group consisting of positive and negative photoresists.

* * * * *